United States Patent [19]
Benyassine et al.

[11] Patent Number: 5,920,853
[45] Date of Patent: Jul. 6, 1999

[54] SIGNAL COMPRESSION USING INDEX MAPPING TECHNIQUE FOR THE SHARING OF QUANTIZATION TABLES

[75] Inventors: Adil Benyassine, Costa Mesa; Huan-Yu Su, San Clemente; Eyal Shlomot, Irvine, all of Calif.

[73] Assignee: Rockwell International Corporation, Newport Beach, Calif.

[21] Appl. No.: 08/702,780

[22] Filed: Aug. 23, 1996

[51] Int. Cl.[6] .............................. G06F 17/30; G06F 5/00
[52] U.S. Cl. ........................ 707/1; 382/232; 382/253; 704/222; 395/200.77
[58] Field of Search .............................. 395/2.09, 200.77; 704/500, 222, 230; 707/1, 3; 348/384, 405, 414, 417, 418, 422; 382/232, 253, 305

[56] References Cited

U.S. PATENT DOCUMENTS

| | | | |
|---|---|---|---|
| 4,963,030 | 10/1990 | Makur | 348/422 |
| 4,969,192 | 11/1990 | Chen et al. | 704/222 |
| 5,253,053 | 10/1993 | Chu et al. | 348/384 |
| 5,300,931 | 4/1994 | Lindsay et al. | 341/106 |
| 5,420,639 | 5/1995 | Perkins | 348/418 |
| 5,506,801 | 4/1996 | Tawel | 364/807 |
| 5,524,170 | 6/1996 | Matsuo et al. | 704/222 |
| 5,592,227 | 1/1997 | Feng | 348/414 |
| 5,619,717 | 4/1997 | Staats | 395/800.36 |

*Primary Examiner*—Maria N. Von Buhr
*Attorney, Agent, or Firm*—Philip K. Yu

[57] ABSTRACT

A signal compression system includes a coder and a decoder. The coder includes an extract unit for extracting an input feature vector from an input signal, a coder memory unit for storing a predesigned vector quantization (VQ) table for the coder such that the coder memory unit uses a set of primary indices to address entries within the pre-designed VQ table, a coder mapping unit for mapping indices from a set of secondary indices to the first set of indices, and a search unit for searching for one index out of the set of secondary indices, wherein the index from the set of secondary indices corresponds to an entry in the coder memory unit, and the entry best represents the input feature vector according to some predetermined criteria. On the decoder side, the decoder includes a decoder memory unit for storing the same pre-designed VQ table and set of primary indices as the coder memory unit, a decoder mapping unit, and a retrieval unit, wherein the entry indicated by the index best represents the input feature vector.

15 Claims, 13 Drawing Sheets

VQ Table 1:

| | | | | | | | | | |
|---|---|---|---|---|---|---|---|---|---|
| 1486 | 2168 | 3751 | 9074 | 12134 | 13944 | 17983 | 19173 | 21190 | 21820 |
| 1730 | 2640 | 3450 | 4870 | 6126 | 7876 | 15644 | 17817 | 20294 | 21902 |
| 1568 | 2256 | 3088 | 4874 | 11063 | 13393 | 18307 | 19293 | 21109 | 21741 |
| 1733 | 2512 | 3357 | 4708 | 6977 | 10296 | 17024 | 17956 | 19145 | 20350 |
| 1744 | 2436 | 3308 | 8731 | 10432 | 12007 | 15614 | 16639 | 21359 | 21913 |
| 1786 | 2369 | 3372 | 4521 | 6795 | 12963 | 17674 | 18988 | 20855 | 21640 |
| 1631 | 2433 | 3361 | 6328 | 10709 | 12013 | 13277 | 13904 | 19441 | 21088 |
| 1489 | 2364 | 3291 | 6250 | 9227 | 10403 | 13843 | 15278 | 17721 | 21451 |
| 1869 | 2533 | 3475 | 4365 | 9152 | 14513 | 15908 | 17022 | 20611 | 21411 |
| 2070 | 3025 | 4333 | 5854 | 7805 | 9231 | 10597 | 16047 | 20109 | 21834 |
| 1910 | 2673 | 3419 | 4261 | 11168 | 15111 | 16577 | 17591 | 19310 | 20265 |
| 1141 | 1815 | 2624 | 4623 | 6495 | 9588 | 13968 | 16428 | 19351 | 21286 |
| 2192 | 3171 | 4707 | 5808 | 10904 | 12500 | 14162 | 15664 | 21124 | 21789 |
| 1286 | 1907 | 2548 | 3453 | 9574 | 11964 | 15978 | 17344 | 19691 | 22495 |
| 1921 | 2720 | 4604 | 6684 | 11503 | 12992 | 14350 | 15262 | 16997 | 20791 |
| 2052 | 2759 | 3897 | 5246 | 6638 | 10267 | 15834 | 16814 | 18149 | 21675 |
| 1798 | 2497 | 5617 | 11449 | 13189 | 14711 | 17050 | 18195 | 20307 | 21182 |
| 1009 | 1647 | 2889 | 5709 | 9541 | 12354 | 15231 | 18494 | 20966 | 22033 |
| 3016 | 3794 | 5406 | 7469 | 12488 | 13984 | 15328 | 16334 | 19952 | 20791 |
| 2203 | 3040 | 3796 | 5442 | 11987 | 13512 | 14931 | 16370 | 17856 | 18803 |
| 2912 | 4292 | 7988 | 9572 | 11562 | 13244 | 14556 | 16529 | 20004 | 21073 |
| 2861 | 3607 | 5923 | 7034 | 9234 | 12054 | 13729 | 18056 | 20262 | 20974 |
| 3069 | 4311 | 5967 | 7367 | 11482 | 12699 | 14309 | 16233 | 18333 | 19172 |
| 2434 | 3661 | 4866 | 5798 | 10383 | 11722 | 13049 | 15668 | 18862 | 19831 |
| 2020 | 2605 | 3860 | 9241 | 13275 | 14644 | 16010 | 17099 | 19268 | 20251 |
| 1877 | 2809 | 3590 | 4707 | 11056 | 12441 | 15622 | 17168 | 18761 | 19907 |
| 2107 | 2873 | 3673 | 5799 | 13579 | 14687 | 15938 | 17077 | 18890 | 19831 |
| 1612 | 2284 | 2944 | 3572 | 8219 | 13959 | 15924 | 17239 | 18592 | 20117 |
| 2420 | 3156 | 6542 | 10215 | 12061 | 13534 | 15305 | 16452 | 18717 | 19880 |
| 1667 | 2612 | 3534 | 5237 | 10513 | 11696 | 12940 | 16798 | 18058 | 19378 |
| 2388 | 3017 | 4839 | 9333 | 11413 | 12730 | 15024 | 16248 | 17449 | 18677 |
| 1875 | 2786 | 4231 | 6320 | 8694 | 10149 | 11785 | 17013 | 18608 | 19960 |
| 679 | 1411 | 4654 | 8006 | 11446 | 13249 | 15763 | 18127 | 20361 | 21567 |
| 1838 | 2596 | 3578 | 4608 | 5650 | 11274 | 14355 | 15886 | 20579 | 21754 |
| 1303 | 1955 | 2395 | 3322 | 12023 | 13764 | 15883 | 18077 | 20180 | 21232 |
| 1438 | 2102 | 2663 | 3462 | 8328 | 10362 | 13763 | 17248 | 19732 | 22344 |
| 860 | 1904 | 6098 | 7775 | 9815 | 12007 | 14821 | 16709 | 19787 | 21132 |
| 1673 | 2723 | 3704 | 6125 | 7668 | 9447 | 13683 | 14443 | 20538 | 21731 |
| 1246 | 1849 | 2902 | 4508 | 7221 | 12710 | 14835 | 16314 | 19335 | 22720 |
| 1525 | 2260 | 3862 | 5659 | 7342 | 11748 | 13370 | 14442 | 18044 | 21334 |
| 1196 | 1846 | 3104 | 7063 | 10972 | 12905 | 14814 | 17037 | 19922 | 22636 |
| 2147 | 3106 | 4475 | 6511 | 8227 | 9765 | 10984 | 12161 | 18971 | 21300 |
| 1585 | 2405 | 2994 | 4036 | 11481 | 13177 | 14519 | 15431 | 19967 | 21275 |
| 1778 | 2688 | 3614 | 4680 | 9465 | 11064 | 12473 | 16320 | 19742 | 20800 |
| 1862 | 2586 | 3492 | 6719 | 11708 | 13012 | 14364 | 16128 | 19610 | 20425 |
| 1395 | 2156 | 2669 | 3386 | 10607 | 12125 | 13614 | 16705 | 18976 | 21367 |
| 1444 | 2117 | 3286 | 6233 | 9423 | 12981 | 14998 | 15853 | 17188 | 21857 |
| 2004 | 2895 | 3783 | 4897 | 6168 | 7297 | 12609 | 16445 | 19297 | 21465 |
| 1495 | 2863 | 6360 | 8100 | 11399 | 14271 | 15902 | 17711 | 20479 | 22061 |
| 2484 | 3114 | 5718 | 7097 | 8400 | 12616 | 14073 | 14847 | 20535 | 21396 |
| 2424 | 3277 | 5296 | 6284 | 11290 | 12903 | 16022 | 17508 | 19333 | 20283 |
| 2565 | 3778 | 5360 | 6989 | 8782 | 10428 | 14390 | 15742 | 17770 | 21734 |
| 2727 | 3384 | 6613 | 9254 | 10542 | 12236 | 14651 | 15687 | 20074 | 21102 |

Figure 6 (1 of 5)   Prior Art

| 1916 | 2953 | 6274 | 8088 | 9710 | 10925 | 12392 | 16434 | 20010 | 21183 |
|------|------|------|------|------|-------|-------|-------|-------|-------|
| 3384 | 4366 | 5349 | 7667 | 11180 | 12605 | 13921 | 15324 | 19901 | 20754 |
| 3075 | 4283 | 5951 | 7619 | 9604 | 11010 | 12384 | 14006 | 20658 | 21497 |
| 1751 | 2455 | 5147 | 9966 | 11621 | 13176 | 14739 | 16470 | 20788 | 21756 |
| 1442 | 2188 | 3330 | 6813 | 8929 | 12135 | 14476 | 15306 | 19635 | 20544 |
| 2294 | 2895 | 4070 | 8035 | 12233 | 13416 | 14762 | 17367 | 18952 | 19688 |
| 1937 | 2659 | 4602 | 6697 | 9071 | 12863 | 14197 | 15230 | 16047 | 18877 |
| 2071 | 2663 | 4216 | 9445 | 10887 | 12292 | 13949 | 14909 | 19236 | 20341 |
| 1740 | 2491 | 3488 | 8138 | 9656 | 11153 | 13206 | 14688 | 20896 | 21907 |
| 2199 | 2881 | 4675 | 8527 | 10051 | 11408 | 14435 | 15463 | 17190 | 20597 |
| 1943 | 2988 | 4177 | 6039 | 7478 | 8536 | 14181 | 15551 | 17622 | 21579 |
| 1825 | 3175 | 7062 | 9818 | 12824 | 15450 | 18330 | 19856 | 21830 | 22412 |
| 2464 | 3046 | 4822 | 5977 | 7696 | 15398 | 16730 | 17646 | 20588 | 21320 |
| 2550 | 3393 | 5305 | 6920 | 10235 | 14083 | 18143 | 19195 | 20681 | 21336 |
| 3003 | 3799 | 5321 | 6437 | 7919 | 11643 | 15810 | 16846 | 18119 | 18980 |
| 3455 | 4157 | 6838 | 8199 | 9877 | 12314 | 15905 | 16826 | 19949 | 20892 |
| 3052 | 3769 | 4891 | 5810 | 6977 | 10126 | 14788 | 15990 | 19773 | 20904 |
| 3671 | 4356 | 5827 | 6997 | 8460 | 12084 | 14154 | 14939 | 19247 | 20423 |
| 2716 | 3684 | 5246 | 6686 | 8463 | 10001 | 12394 | 14131 | 16150 | 19776 |
| 1945 | 2638 | 4130 | 7995 | 14338 | 15576 | 17057 | 18206 | 20225 | 20997 |
| 2304 | 2928 | 4122 | 4824 | 5640 | 13139 | 15825 | 16938 | 20108 | 21054 |
| 1800 | 2516 | 3350 | 5219 | 13406 | 15948 | 17618 | 18540 | 20531 | 21252 |
| 1436 | 2224 | 2753 | 4546 | 9657 | 11245 | 15177 | 16317 | 17489 | 19135 |
| 2319 | 2899 | 4980 | 6936 | 8404 | 13489 | 15554 | 16281 | 20270 | 20911 |
| 2187 | 2919 | 4610 | 5875 | 7390 | 12556 | 14033 | 16794 | 20998 | 21769 |
| 2235 | 2923 | 5121 | 6259 | 8099 | 13589 | 15340 | 16340 | 17927 | 20159 |
| 1765 | 2638 | 3751 | 5730 | 7883 | 10108 | 13633 | 15419 | 16808 | 18574 |
| 3460 | 5741 | 9596 | 11742 | 14413 | 16080 | 18173 | 19090 | 20845 | 21601 |
| 3735 | 4426 | 6199 | 7363 | 9250 | 14489 | 16035 | 17026 | 19873 | 20876 |
| 3521 | 4778 | 6887 | 8680 | 12717 | 14322 | 15950 | 18050 | 20166 | 21145 |
| 2141 | 2968 | 6865 | 8051 | 10010 | 13159 | 14813 | 15861 | 17528 | 18655 |
| 4148 | 6128 | 9028 | 10871 | 12686 | 14005 | 15976 | 17208 | 19587 | 20595 |
| 4403 | 5367 | 6634 | 8371 | 10163 | 11599 | 14963 | 16331 | 17982 | 18768 |
| 4091 | 5386 | 6852 | 8770 | 11563 | 13290 | 15728 | 16930 | 19056 | 20102 |
| 2746 | 3625 | 5299 | 7504 | 10262 | 11432 | 13172 | 15490 | 16875 | 17514 |
| 2248 | 3556 | 8539 | 10590 | 12665 | 14696 | 16515 | 17824 | 20268 | 21247 |
| 1279 | 1960 | 3920 | 7793 | 10153 | 14753 | 16646 | 18139 | 20679 | 21466 |
| 2440 | 3475 | 6737 | 8654 | 12190 | 14588 | 17119 | 17925 | 19110 | 19979 |
| 1879 | 2514 | 4497 | 7572 | 10017 | 14948 | 16141 | 16897 | 18397 | 19376 |
| 2804 | 3688 | 7490 | 10086 | 11218 | 12711 | 16307 | 17470 | 20077 | 21126 |
| 2023 | 2682 | 3873 | 8268 | 10255 | 11645 | 15187 | 17102 | 18965 | 19788 |
| 2823 | 3605 | 5815 | 8595 | 10085 | 11469 | 16568 | 17462 | 18754 | 19876 |
| 2851 | 3681 | 5280 | 7648 | 9173 | 10338 | 14961 | 16148 | 17559 | 18474 |
| 1348 | 2645 | 5826 | 8785 | 10620 | 12831 | 16255 | 18319 | 21133 | 22586 |
| 2141 | 3036 | 4293 | 6082 | 7593 | 10629 | 17158 | 18033 | 21466 | 22084 |
| 1608 | 2375 | 3384 | 6878 | 9970 | 11227 | 16928 | 17650 | 20185 | 21120 |
| 2774 | 3616 | 5014 | 6557 | 7788 | 8959 | 17068 | 18302 | 19537 | 20542 |
| 1934 | 4813 | 6204 | 7212 | 8979 | 11665 | 15989 | 17811 | 20426 | 21703 |
| 2288 | 3507 | 5037 | 6841 | 8278 | 9638 | 15066 | 16481 | 21653 | 22214 |
| 2951 | 3771 | 4878 | 7578 | 9016 | 10298 | 14490 | 15242 | 20223 | 20990 |
| 3256 | 4791 | 6601 | 7521 | 8644 | 9707 | 13398 | 16078 | 19102 | 20249 |
| 1827 | 2614 | 3486 | 6039 | 12149 | 13823 | 16191 | 17282 | 21423 | 22041 |
| 1000 | 1704 | 3002 | 6335 | 8471 | 10500 | 14878 | 16979 | 20026 | 22427 |
| 1646 | 2286 | 3109 | 7245 | 11493 | 12791 | 16824 | 17667 | 18981 | 20222 |
| 1708 | 2501 | 3315 | 6737 | 8729 | 9924 | 16089 | 17097 | 18374 | 19917 |
| 2623 | 3510 | 4478 | 5645 | 9862 | 11115 | 15219 | 18067 | 19583 | 20382 |

Figure 6 (2 of 5)     Prior Art

| 2518 | 3434 | 4728 | 6388 | 8082 | 9285 | 13162 | 18383 | 19819 | 20552 |
|---|---|---|---|---|---|---|---|---|---|
| 1726 | 2383 | 4090 | 6303 | 7805 | 12845 | 14612 | 17608 | 19269 | 20181 |
| 2860 | 3735 | 4838 | 6044 | 7254 | 8402 | 14031 | 16381 | 18037 | 19410 |
| 4247 | 5993 | 7952 | 9792 | 12342 | 14653 | 17527 | 18774 | 20831 | 21699 |
| 3502 | 4051 | 5680 | 6805 | 8146 | 11945 | 16649 | 17444 | 20390 | 21564 |
| 3151 | 4893 | 5899 | 7198 | 11418 | 13073 | 15124 | 17673 | 20520 | 21861 |
| 3960 | 4848 | 5926 | 7259 | 8811 | 10529 | 15661 | 16560 | 18196 | 20183 |
| 4499 | 6604 | 8036 | 9251 | 10804 | 12627 | 15880 | 17512 | 20020 | 21046 |
| 4251 | 5541 | 6654 | 8318 | 9900 | 11686 | 15100 | 17093 | 20572 | 21687 |
| 3769 | 5327 | 7865 | 9360 | 10684 | 11818 | 13660 | 15366 | 18733 | 19882 |
| 3083 | 3969 | 6248 | 8121 | 9798 | 10994 | 12393 | 13686 | 17888 | 19105 |
| 2731 | 4670 | 7063 | 9201 | 11346 | 13735 | 16875 | 18797 | 20787 | 22360 |
| 1187 | 2227 | 4737 | 7214 | 9622 | 12633 | 15404 | 17968 | 20262 | 23533 |
| 1911 | 2477 | 3915 | 10098 | 11616 | 12955 | 16223 | 17138 | 19270 | 20729 |
| 1764 | 2519 | 3887 | 6944 | 9150 | 12590 | 16258 | 16984 | 17924 | 18435 |
| 1400 | 3674 | 7131 | 8718 | 10688 | 12508 | 15708 | 17711 | 19720 | 21068 |
| 2322 | 3073 | 4287 | 8108 | 9407 | 10628 | 15862 | 16693 | 19714 | 21474 |
| 2630 | 3339 | 4758 | 8360 | 10274 | 11333 | 12880 | 17374 | 19221 | 19936 |
| 1721 | 2577 | 5553 | 7195 | 8651 | 10686 | 15069 | 16953 | 18703 | 19929 |

Figure 6 (3 of 5)     Prior Art

VQ Table 2:

| | | | | |
|---|---|---|---|---|
| -435 | -815 | -742 | 1033 | -518 |
| -833 | -891 | 463 | -8 | -1251 |
| -1021 | 231 | -306 | 321 | -220 |
| 57 | -198 | -339 | -33 | -1468 |
| 171 | -350 | 294 | 1660 | 453 |
| -701 | -842 | -58 | 950 | 892 |
| 584 | 31 | -289 | 356 | -333 |
| -109 | -808 | 231 | 77 | -87 |
| -859 | 1236 | 550 | 854 | 714 |
| -877 | -954 | -1248 | -299 | 212 |
| -77 | 344 | -620 | 763 | 413 |
| -314 | -307 | -256 | -1260 | -429 |
| 711 | 693 | 521 | 650 | 1305 |
| -112 | -271 | -500 | 946 | 1733 |
| 575 | -10 | -468 | -199 | 1101 |
| 145 | -285 | -1280 | -398 | 36 |
| -1133 | -835 | 1350 | 1284 | -95 |
| -1459 | -1237 | 416 | -213 | 466 |
| -15 | 66 | 468 | 1019 | -748 |
| -338 | 148 | 1445 | 75 | -760 |
| 389 | 239 | 1568 | 981 | 113 |
| -312 | -98 | 949 | 31 | 1104 |
| 1127 | 584 | 835 | 277 | -1159 |
| 539 | -114 | 856 | -493 | 223 |
| 2197 | 2337 | 1268 | 670 | 304 |
| -1596 | 550 | 801 | -456 | -56 |
| 1154 | 593 | -77 | 1237 | -31 |
| 397 | 558 | 203 | -797 | -919 |
| 334 | 1475 | 632 | -80 | 48 |
| -545 | -330 | -429 | -680 | 1133 |
| 1320 | 827 | -398 | -576 | 341 |
| -163 | 674 | -11 | -886 | 531 |

Figure 6 (4 of 5)    Prior Art

VQ Table 3:

| | | | | |
|---|---|---|---|---|
| 582 | -1201 | 829 | 86 | 385 |
| 1450 | 72 | -231 | 864 | 661 |
| -163 | -526 | -754 | -1633 | 267 |
| 573 | 796 | -169 | -631 | 816 |
| 519 | 291 | 159 | -640 | -1296 |
| 1549 | 715 | 527 | -714 | -193 |
| -457 | 612 | -283 | -1381 | -741 |
| -344 | 1341 | 1087 | -654 | -569 |
| -543 | -1752 | -195 | -98 | -276 |
| -235 | -728 | 949 | 1517 | 895 |
| 502 | -362 | -960 | -483 | 1386 |
| 450 | -466 | -108 | 1010 | 2223 |
| -28 | -378 | 744 | -1005 | 240 |
| 271 | -15 | 909 | -259 | 1688 |
| -1011 | 581 | -53 | -747 | 878 |
| -498 | -1377 | 18 | -444 | 1483 |
| 1015 | -222 | 443 | 372 | -354 |
| 669 | 659 | 1640 | 932 | 534 |
| 1385 | -182 | -907 | -721 | -262 |
| 569 | 1247 | 337 | 416 | -121 |
| 369 | -1003 | -507 | -587 | -904 |
| 72 | -141 | 1465 | 63 | -785 |
| 208 | 301 | -882 | 117 | -404 |
| -912 | 623 | -76 | 276 | -440 |
| -267 | -525 | 140 | 882 | -139 |
| -697 | 865 | 1060 | 413 | 446 |
| 581 | -1037 | -895 | 669 | 297 |
| 3 | 692 | -292 | 1050 | 782 |
| -1061 | -484 | 362 | -597 | -852 |
| -1182 | -744 | 1340 | 262 | 63 |
| -774 | -483 | -1247 | -70 | 98 |
| -1125 | -265 | -242 | 724 | 934 |

Figure 6 (5 of 5)   Prior Art

Mapping Unit 1

| Secondary Index | Primary Index |
|---|---|
| 0 | 96 |
| 1 | 52 |
| 2 | 20 |
| 3 | 54 |
| 4 | 86 |
| 5 | 114 |
| 6 | 82 |
| 7 | 68 |
| 8 | 36 |
| 9 | 121 |
| 10 | 48 |
| 11 | 92 |
| 12 | 18 |
| 13 | 120 |
| 14 | 94 |
| 15 | 124 |
| 16 | 50 |
| 17 | 125 |
| 18 | 4 |
| 19 | 100 |
| 20 | 28 |
| 21 | 76 |
| 22 | 12 |
| 23 | 117 |
| 24 | 81 |
| 25 | 22 |
| 26 | 90 |
| 27 | 116 |
| 28 | 127 |
| 29 | 21 |
| 30 | 108 |
| 31 | 66 |

Mapping Unit 2

| Secondary Index | Primary Index |
|---|---|
| 0 | 31 |
| 1 | 21 |
| 2 | 9 |
| 3 | 3 |
| 4 | 10 |
| 5 | 2 |
| 6 | 19 |
| 7 | 26 |
| 8 | 4 |
| 9 | 3 |
| 10 | 11 |
| 11 | 29 |
| 12 | 15 |
| 13 | 27 |
| 14 | 21 |
| 15 | 12 |

Mapping Unit 3

| Secondary Index | Primary Index |
|---|---|
| 0 | 16 |
| 1 | 1 |
| 2 | 0 |
| 3 | 0 |
| 4 | 8 |
| 5 | 25 |
| 6 | 22 |
| 7 | 20 |
| 8 | 19 |
| 9 | 23 |
| 10 | 20 |
| 11 | 31 |
| 12 | 4 |
| 13 | 31 |
| 14 | 20 |
| 15 | 31 |

SIGNAL COMPRESSION USING INDEX MAPPING TECHNIQUE FOR THE SHARING OF QUANTIZATION TABLES

FIELD OF INVENTION

The present invention relates to data compression in communications systems and in particular to scalar and vector quantization in speech, audio and image coding using embedded design.

ART BACKGROUND

Modern communications systems rely heavily on data compression techniques for "lossy" coding of signals such as speech, audio, still images and video sequences. As can be understood by those skilled in the art, coding of signals can done in either "lossy" or "lossless" methods, where lossy coding means that some distortion is introduced to the input signal by the coding system.

FIG. 1 depicts a general structure of a module (10) for signal compression and decompression in accordance with the present invention. The module (10) comprises an encoder (100) and a decoder (150). For data-receiving operations, only a decoder (150) is required. For data transmissions between two separate stations, the encoder and decoder should be provided at both the transmitting station and the receiving station. As a conceptual tool, compression will be described as occurring at the encoder (100) and decompression will be described as occurring at the decoder (150). In practical implementation, the encoder (100) and decoder (150) are contained in a single data module (10), which is implemented at both the transmitter station and receiver station.

The input signal (110) to the system is fed into the feature extraction unit (120) of the encoder (100). The extracted features are quantized by the feature quantization unit (130) and the resulting representation (131), which may include indices, is sent to the decoder (150). The features decoding unit (160) receives the lossy representation (151) and generates the lossy version (161) of the features from the lossy representation (151). The lossy version (161) is used by the signal reconstruction module (170) to produce the reconstructed output signal (180).

As can be understood from the description above, quantization methods play a major role in data compression. Quantization can be done on a single feature of the compressed signal, commonly called Scalar Quantization (SQ), or can be performed on a vector of features, commonly called Vector Quantization (VQ). Since a single feature can be regarded as a one-dimensional vector, SQ can be considered as a particular case of VQ. In the following description of this disclosure, the VQ schemes will be discussed. An example of speech coding algorithm which utilizes VQ as well as SQ is the recently adopted International Telecommunications Union (ITU) Recommendation G.729.

The concept of VQ is a well-established technique for signal compression. The technique can be generalized as follows. A table which holds a set of vectors, representing the signal (or some features of the signal), is first constructed. For each vector of the original signal (or a feature vector), the table is searched for the best representative entry in the table. The index of that entry is then stored or transmitted. Using the index as a pointer to an entry in the table, a lossy version of the original vector can be retrieved. The quantization table can be stored or can be represented according to some rule(s), such as a mapping scheme from an index to a vector.

FIG. 2 illustrates a typical structure of a VQ encoder (200) and a VQ decoder (250). The input vector (215) is presented to the search unit (220). The search unit (220) compares the input vector to each of the vectors stored in the VQ table (225), using the comparison unit (230). The comparison unit (230) compares the input vector to a vector in the table (225) using a distance measure which can also depend on a vector of distance parameters (235). The index (140) of the best representative vector is stored or transmitted to the VQ decoder (250) through a communications channel (245). The VQ decoder (250), including a retrieval unit (255), uses the index (240) to retrieve an entry from a copy (260) of the VQ table (225), which becomes the decoded output (265).

In some applications, the VQ table may be represented by a few smaller tables and a combining unit. The single index into the former larger table can be replaced with a few indices into these small tables. Upon retrieval, the entries from all the tables are combined into one output vector. Such VQ systems are commonly called "product code VQ."

The basic structure of a product code VQ is depicted in FIG. 3. A produce code encoder (310) communicates with a product code decoder (350) (or "VQ decoder") via a communication channel (345) coupled to a retrieval unit (360). The input vector (315) is presented to the search unit (320). The search unit (320) compares the input vector to the entries in the multiple VQ tables (325), using the comparison unit (330). The comparison unit (330) compares the input vector to some combination of the vectors in the tables using a distance measure which can depend also on a vector of distance parameters (335). The indices (340) are stored or transmitted to the VQ decoder (350). The VQ decoder (350) uses the indices (340) to retrieve the entries from a copy (355) of the VQ table (325) and combine them using a combining unit (365). The combined vector becomes the decoded output (370).

Commonly, each signal compression scheme (such as a speech coding algorithm) uses specifically pre-designed quantization tables, which might be large and occupy a significant portion of the available memory.

However, in many practical applications, different compression schemes are used for the same signal. For example, different coding algorithms can be used for different rates in a variable-rate speech coding scheme. Hence, a method for sharing quantization tables in those cases is greatly desired. If all the schemes are designed at the same time, quantization tables can be shared by a technique called Constrained Storage VQ ("CSVQ"). However, if a new compression scheme is designed to work together with an already existing compression scheme, a new approach to the sharing of quantization tables is needed.

SUMMARY OF THE PRESENT INVENTION

A signal compression system is disclosed, which generally comprises a coder and a decoder. The coder comprises an extraction unit for extracting an input feature vector from an input signal, a coder memory unit for storing a pre-designed VQ table for the coder with the coder memory unit using a set of primary indices to address entries within the pre-designed VQ table, a coder mapping unit for mapping indices from a set of secondary indices to the set of primary indices with the set of secondary indices corresponding to a pre-selected subset of the pre-designed VQ table, a search unit for searching for one index out of the set of secondary indices with the index from the set of secondary indices corresponding to an entry in the coder memory unit, wherein the entry best represents the input feature vector according to some predetermined criteria. The index from the set of secondary indices can then be transmitted through a communications channel.

On the decoder side, the decoder comprises a decoder memory unit for storing the same pre-designed VQ table as the coder memory unit with the decoder memory unit also using the set of primary indices to address entries within the pre-designed VQ table, a decoder mapping unit for mapping the one index from the set of secondary indices to one index from the set of primary indices, a retrieval unit for retrieving an entry from the decoder memory unit by mapping the one index from the set of primary indices to an entry from the decoder memory unit, wherein the entry best represents the input feature vector.

The index mapping approach in accordance with the present invention can be applied to address the problem of spectral quantization for speech signals, as well as spectral quantization of the background noise presented during silence periods. In many speech communications systems, the pre-designed VQ table (420) is designed for a faithful representation of the speech spectrum. However, the background noise during silence periods can be faithfully represented using a smaller number of bits and smaller quantization tables. A subset of the tables used for speech spectral quantization can be chosen to represent the spectrum of the background noise, and the index mapping technique described above can be used to represent this subset. Further, different search units and comparison units can be used for speech spectral quantization and for background noise spectral quantization.

BRIEF DESCRIPTION OF THE DRAWINGS

FIG. 6 lists the three (3) pre-designed VQ tables in accordance with the ITU Recommendations G.729/G.729A.

FIG. 7 lists the three (3) index mapping units for the three (3) VQ tables in accordance with the present invention.

DETAILED DESCRIPTION OF THE PREFERRED EMBODIMENT

An efficient data compression and decompression system using VQ for a communications system is disclosed. In the following description, numerous specific details are set forth, such as tables, indices, or memory sizes, in order to provide a thorough understanding of the present invention. It should be understood, however, by those skilled in the art that these details are not required to practice the present invention. In other instances, well known circuits, methods and the like are not set forth in detail to avoid unnecessarily obscuring the present invention.

In any speech coding system, the quantization of the speech spectrum requires a substantial number of bits for its faithful representation in order to cover the wide range of speech spectra. However, a background acoustic noise is almost always present during typical speech communications in a car, in an office or on the street. The spectrum of the background noise has a much smaller dynamic range than that of speech communications, and thus requires much fewer number of bits for its faithful representation. Therefore, the usage of the conventional quantization scheme for the speech spectrum in order to quantize the background noise spectrum has become redundant due to the number of bits required.

A possible solution to the above-described problem is to have a different representation for the spectrum of the background noise. This representation may also be of the form of tables which have smaller sizes than the ones used for speech, due to the considerably fewer number of bits needed for the spectrum representation of the background noise. However, this approach ends up requiring a substantial increase in memory storage for the new tables, as can be appreciated by those skilled in the art.

A further improved approach to the above-described problem is to use a reduced version of the existing tables, which represent the speech spectrum, for the representation of the background noise spectrum. To that end, an auxiliary look-up table of an extremely small memory storage requirement can be designed. This auxiliary table uses indices of the pre-selected useful entries from the speech spectrum tables. As can be appreciated by those skilled in the art, this approach will result in a much less complex system, as well as fewer number of bits for representing the background noise.

Figure 1:
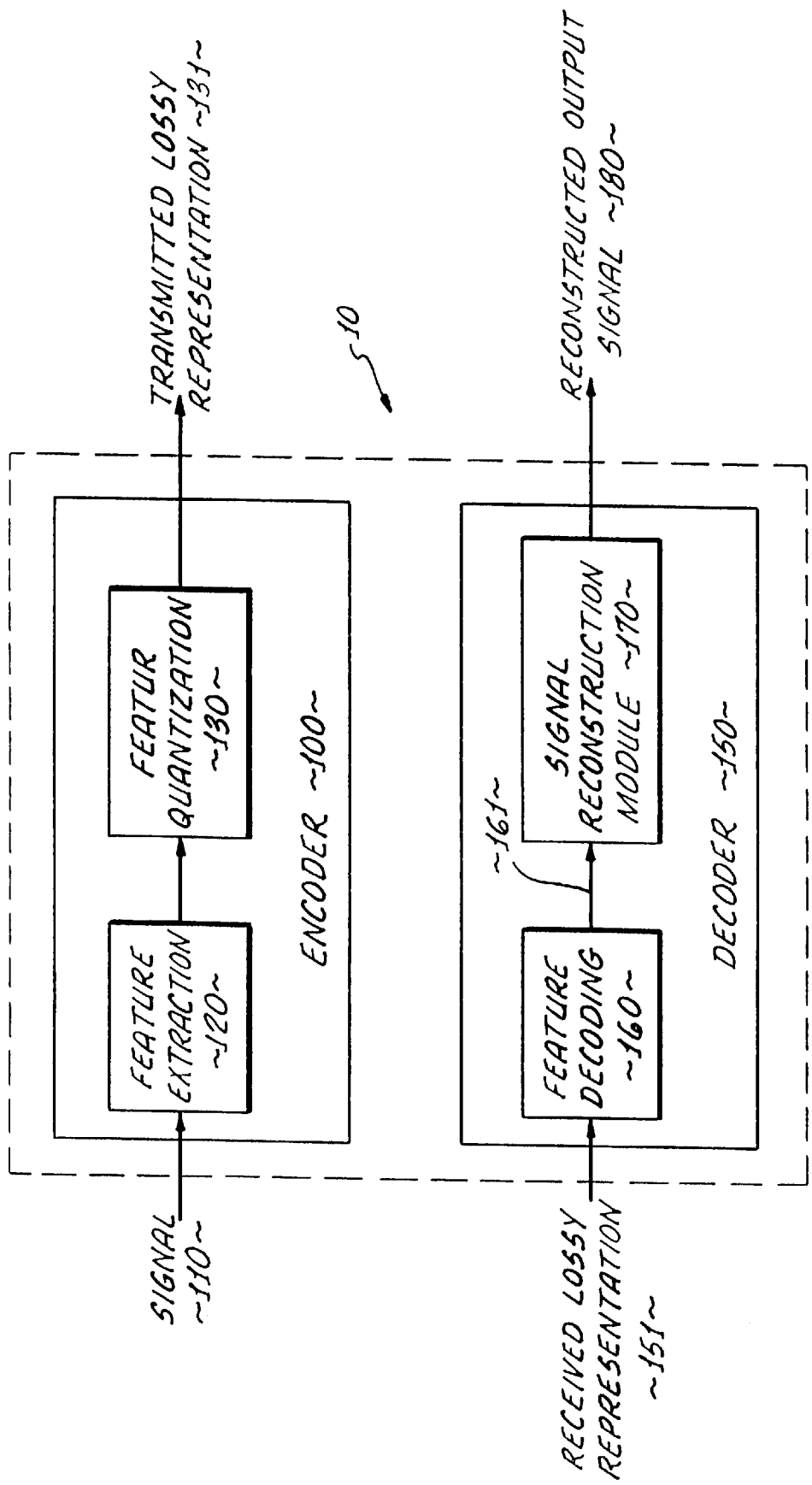
FIG. 1 depicts a typical structure of a module for signal compression and decompression using VQ quantization.
Figure 2:
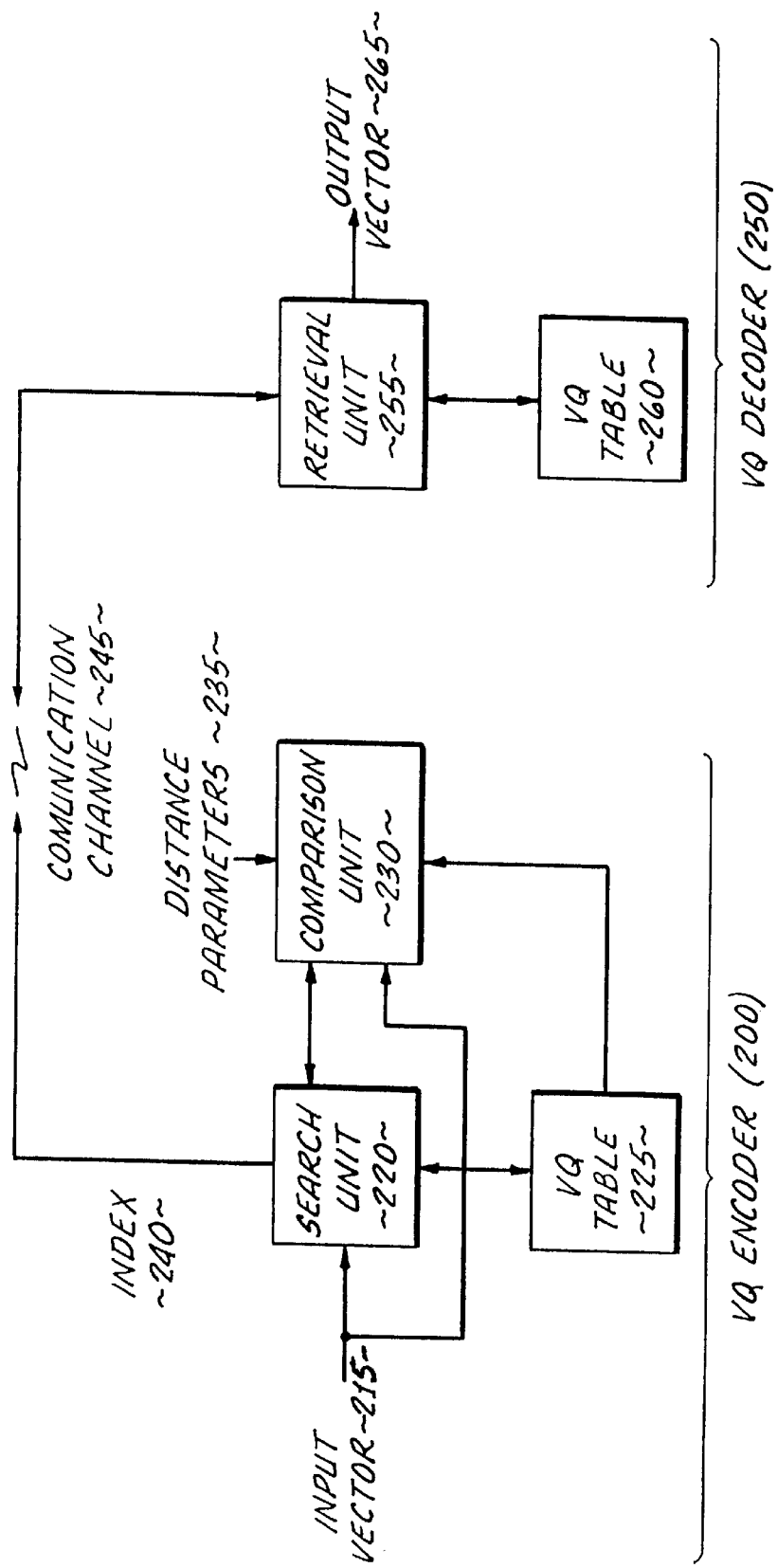
FIG. 2 depicts a typical structure of a VQ encoder and a VQ decoder.
Figure 4:
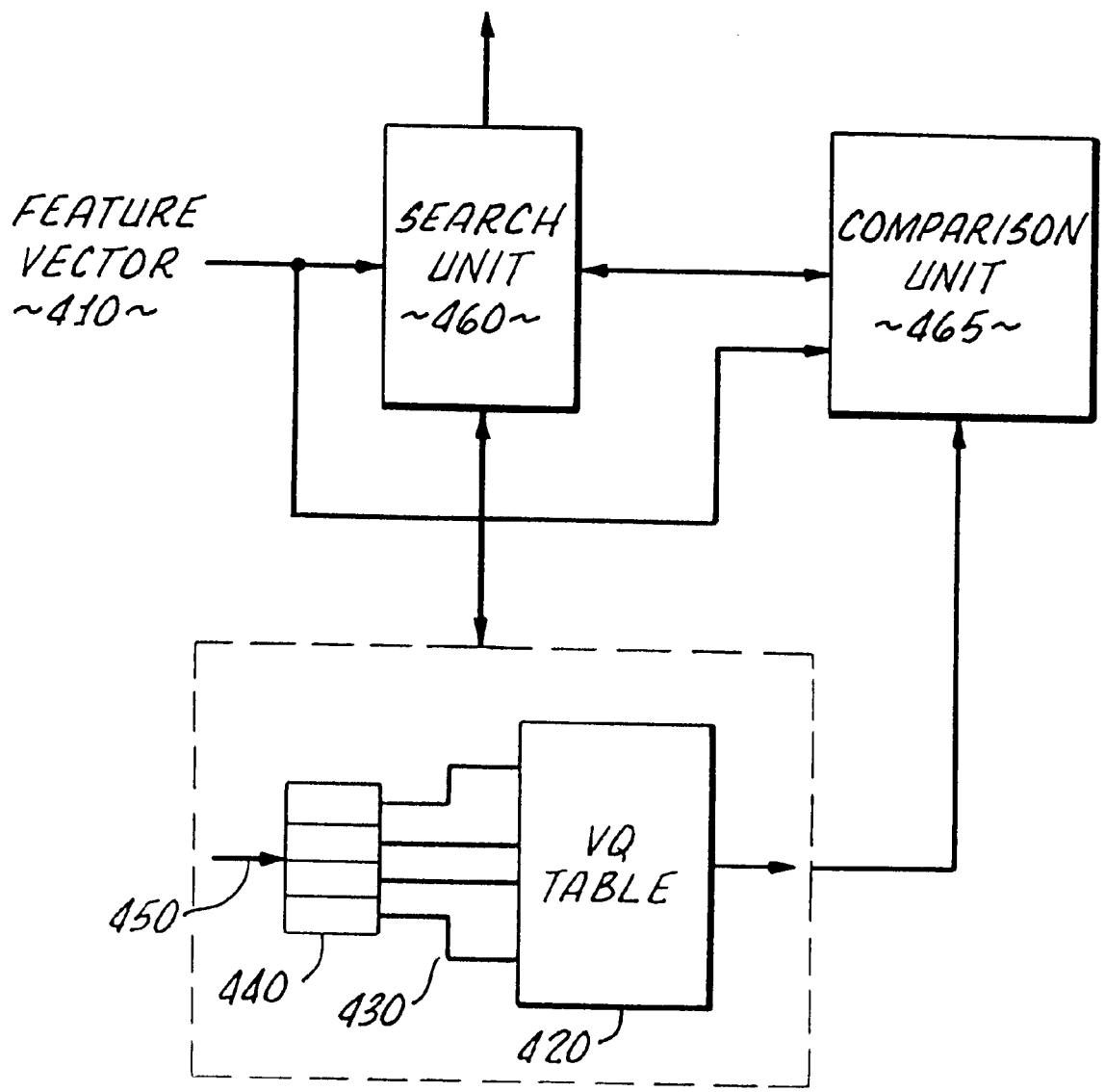
FIG. 4 depicts a generalized structure of the index mapping system in accordance with the present invention.

With the above described system in mind, the data compression system in accordance with the present invention uses a scheme of index mapping, which can be implemented using a table of look-up pointers, for sharing quantization tables. The basic structure of an index mapping system is described in FIG. 4. A feature vector (410) has to be quantized by a pre-designed VQ table (420). However, only a predetermined subset of the entries of the pre-designed VQ table (420) needs to be used for the quantization of the feature vector (410). This pre-determined subset of the entries is defined by its set of primary indices (430) into the quantization table (420). The set of primary indices (430) is generated by a mapping unit (440) from a set of secondary indices (450). A search unit (460) runs over all the indices in the set of secondary indices (450), each defining a unique entry in the VQ table (420) by the index mapping unit (440), and chooses the entry from the pre-determined subset of the entries which best represents the features vector according to a predetermined set of criteria, through the comparison unit (465). The indices from the set of secondary indices (450) are now describing the "lossy" representation (131) of the features vector (410) and transmitted to by a decoder (150) of FIG. 1.

Figure 3:
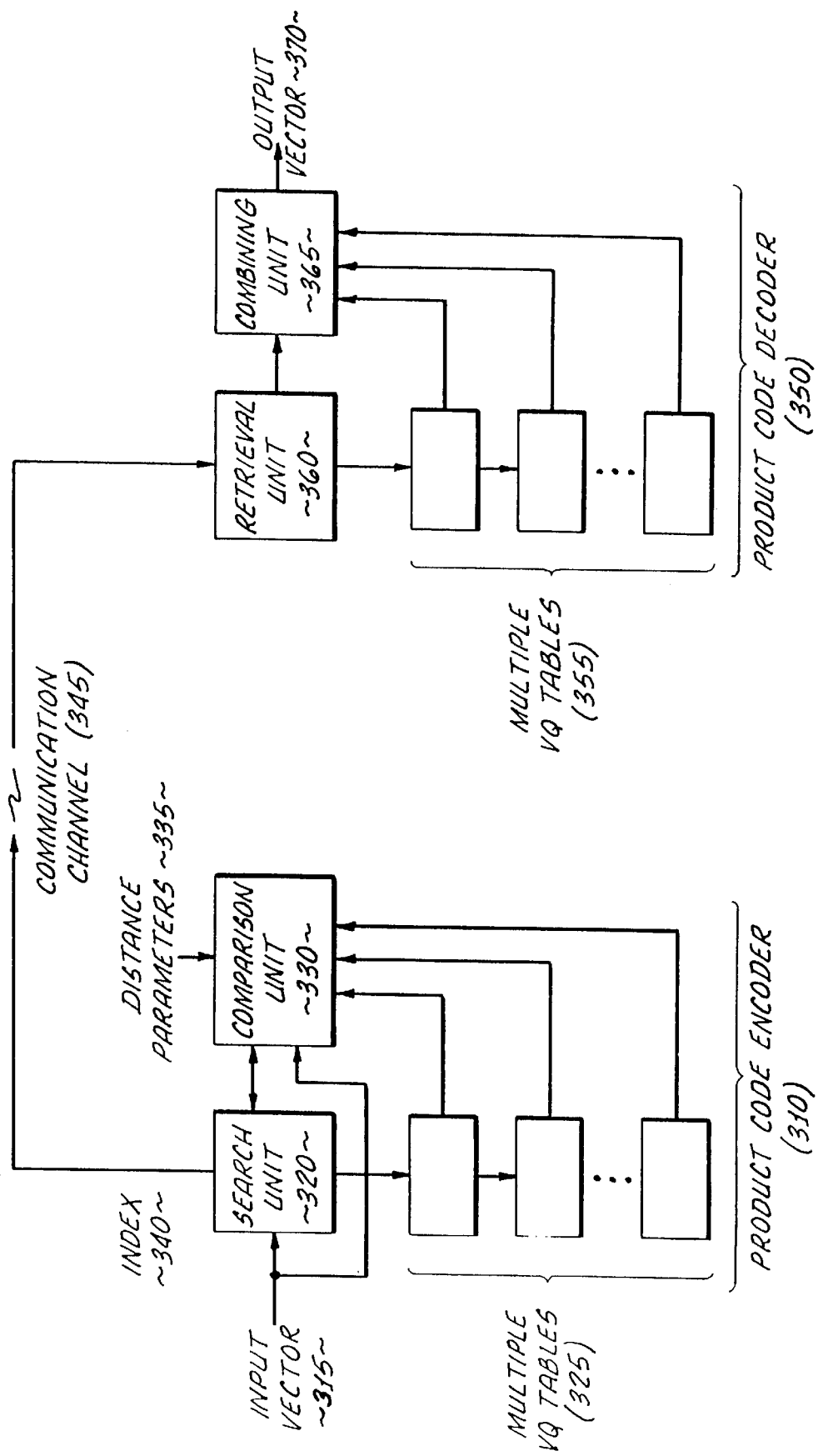
FIG. 3 depicts a basic structure of a product code VQ.

The index mapping technique described above can be extended to include a multiplicity of pre-designed VQ tables and a multiplicity of index mapping units for the implementation of various product code VQ systems (as in FIG. 3). Note that in FIG. 3, each VQ table (325, 355) can be implemented by a unique pair of index mapping unit and a pre-designed VQ table such as index 440 and table 420 in FIG. 4.

The index mapping approach in accordance with the present invention may be further applied to address the problem of spectral quantization for speech signals, as well as spectral quantization of the background noise presented during silence periods. In many speech communications systems, the pre-designed VQ table (420) is designed for a faithful representation of the speech spectrum. Similarly, the background noise during silence periods can also be faithfully represented using smaller number of bits and smaller quantization tables. A subset of the tables used for speech spectral quantization can be chosen to represent the spectrum of the background noise, and the index mapping technique described above can be used to represent this subset. As should be noted, different search units and comparison units can be used for speech spectral quantization and for background noise spectral quantization.

A 3-table product code VQ with 128, 32, and 32 entries is used for spectral quantization of speech signals in the ITU Recommendations G.729 and Annex A of Recommendations G.729 ("G.729A"). The 3-table product code VQ according to the Recommendations is listed in FIG. 6. However, as contributed by Assignee of the present invention, for the quantization of the background noise in Recommendations G.729B, only 32, 16 and 16 entries, respectively, out of the 3 VQ tables are needed. The 3 mapping units for the 3 VQ tables in accordance with the present invention are listed in FIG. 7. The contents of ITU Recommendations G.729, G.729A and G.729B ("Coding of Speech at 8 kbit/s Using Conjugate-Structured Algebraic-Code-Excited Linear-Prediction" and its Annexes A and B) are hereby incorporated by reference.

Figure 5:
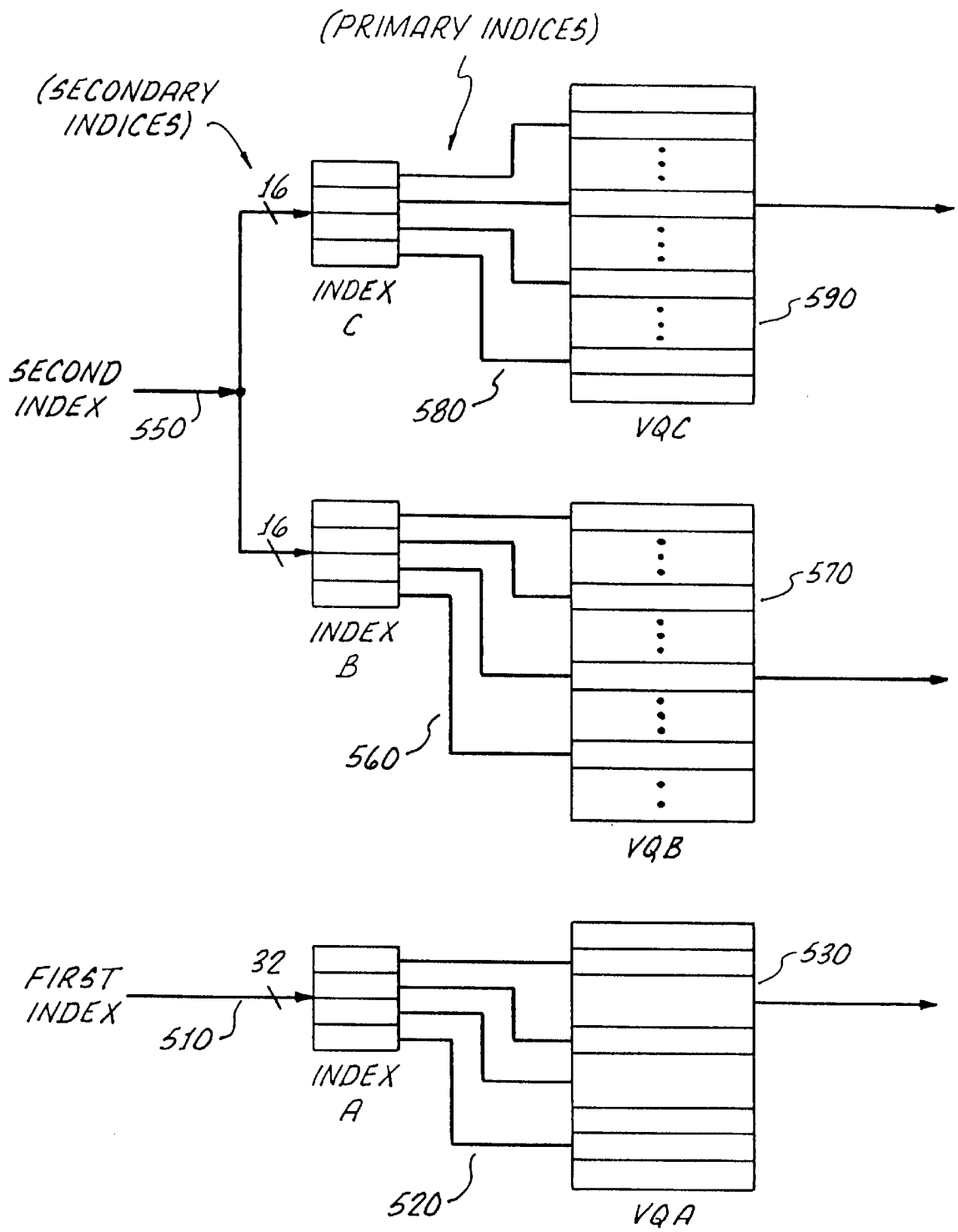
FIG. 5 depicts a generalize structure of multiple index mapping system in accordance with the present invention.

FIG. 5 depicts an index mapping system for the quantization of the background noise according to the ITU Recommendations G.729B. Two indices are used to describe the entries into the VQ tables. The first index (510) is mapped by the first index mapping module (520) into the first VQ table (530). The second index (550) is mapped by the second index mapping module (560) into the second VQ table (570) and is also mapped by the third index mapping module (580) into the third VQ table (590).

From the above description, a methodology for sharing quantization tables between different data compression schemes have been disclosed. The methodology uses index mapping technique into existing quantization tables for table space reduction and memory saving. In particular, the methodology according to the present invention allows for sharing spectral quantization tables between Recommendations G.729/G.729A and G.729B.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

We claim:

1. A system for coding and decoding feature vectors of a signal transmitted through a communications channel, comprising a coder and a decoder, wherein:

a) the coder comprises:

extraction means for extracting an input feature vector from the signal;

coder memory means for storing one pre-designed VQ table for the coder, the coder memory means using a set of primary indices to address entries within the pre-designed VQ table;

coder mapping unit for mapping indices from a set of fixed length secondary indices to the set of primary indices, the set of secondary indices corresponding to one pre-selected subset of the pre-designed VQ table;

search means coupled to the coder mapping unit for searching for one index out of the set of secondary indices, wherein the one index from the set of secondary indices corresponds to one index from the set of primary indices which corresponds to an entry in the coder memory means, wherein the entry in the coder memory means which best represents the input feature vector according to predetermined criteria;

b) the decoder comprises:

decoder memory means for storing the same at least one pre-designed VQ table as stored by the coder memory means, the decoder memory means also using the set of primary indices to address entries within the pre-designed VQ table;

decoder mapping unit for mapping the one index from the set of secondary indices to one index from the set of primary indices;

retrieval means for retrieving an entry from the decoder memory means by mapping the one index from the set of primary indices as mapped by the decoder mapping unit to one entry from the decoder memory means, wherein the entry best represents the input feature vector.

2. A system according to claim 1, wherein:

the coder mapping unit comprises a lookup table; and the decoder mapping unit comprises a lookup table.

3. A coder for coding feature vectors of a signal for processing, comprising:

extraction means for extracting an input feature vector from the signal;

coder memory means for storing one pre-designed VQ table for the coder, the coder memory means using a set of primary indices to address entries within the pre-designed VQ table;

coder mapping unit for mapping indices from a set of fixed length secondary indices to the set of primary indices, the set of secondary indices corresponding to one pre-selected subset of the pre-designed VQ table;

search means coupled to the coder mapping unit for searching for one index out of the set of secondary indices, wherein the one index from the set of secondary indices corresponds to one index from the set of primary indices which corresponds to an entry in the coder memory means, wherein the entry in the coder memory means best represents the input feature vector according to predetermined criteria to an entry in the coder memory means which best represents the input feature vector according to predetermined criteria.

4. A decoder for decoding a feature vector of a signal received from a coder having a pre-designed VQ table, a set of primary indices, and a set of fixed length secondary indices associated therewith, said decoder comprising:

decoder memory means for storing the pre-designed VQ table and a pre-selected subset of the pre-designed VQ table associated with the set of secondary indices, wherein the decoder memory means uses the set of primary indices to address entries within the pre-designed VQ table;

decoder mapping unit for mapping an index from the set of secondary indices to an index from the set of primary indices;

retrieval means for retrieving an entry from the decoder memory means by mapping the index from the set of primary indices as mapped by the decoder mapping unit to an entry from the decoder memory means, wherein the entry best represents the feature vector.

5. A system for coding and decoding feature vectors of a signal transmitted through a communications channel, comprising a coder and a decoder, wherein:

a) the coder comprises:

extraction means for extracting an input feature vector from the signal;

coder memory means for storing at least one pre-designed VQ table for the coder, the coder memory means using at least one set of primary indices to address entries within the at least one pre-designed VQ table;

at least one coder mapping unit for mapping indices from at least one set of fixed length secondary indices to the at least one set of primary indices, the at least one set of secondary indices corresponding to at least one pre-selected subset of the pre-designed VQ table;

search means coupled to the coder mapping means for searching for at least one index out of the at least one set of secondary indices, wherein the at least one index from the at least one set of secondary indices corresponds to at least one index from the at least one set of primary indices which corresponds to at least one entry in the coder memory means, wherein the at least one entry in the coder memory means best represents the input feature vector according to predetermined criteria to at least one entry in the coder memory means which best represents to the input feature vector according to predetermined criteria;

b) the decoder comprises:

decoder memory means for storing at least one pre-designed VQ table which is the same as stored by the coder memory means, the decoder memory means also using at least one set of primary indices to address entries within the at least one pre-designed VQ table;

decoder mapping unit for mapping the at least one index from the least one set of secondary indices to the at least one set of primary indices;

retrieval means for retrieving at least one entry from the decoder memory means by mapping the at least one index from the at least one set of primary indices as mapped by the decoder mapping unit to at least one entry from the decoder memory means, wherein the at least one entry best represents the input feature vector.

6. A coder for coding feature vectors of a signal, comprising:

extraction means for extracting an input feature vector from the signal;

coder memory means for storing at least one pre-designed VQ table for the coder, the coder memory means using at least one set of primary indices to address entries within the at least one pre-designed VQ table;

at least one coder mapping unit for mapping indices from at least one set of fixed length secondary indices to the at least one set of primary indices, the at least one set of secondary indices corresponding to at least one pre-selected subset of the pre-designed VQ table;

search means coupled to the coder mapping means for searching for at least one index out of the at least one set of secondary indices, wherein the at least one index corresponds to at least one index from the at least one set of primary indices which corresponds to at least one entry in the coder memory means, wherein the at least one entry in the coder memory means best represents the input feature vector according to predetermined criteria to at least one entry in the coder memory means which best represents to the input feature vector according to predetermined criteria.

7. A decoder for decoding a feature vector of a signal, which is coded by a coder comprising coder memory means with at least one pre-designed VQ table, said decoder comprising:

decoder memory means for storing said at least one pre-designed VQ table and a pre-selected subset of the pre-designed VQ table associated with a set of fixed length secondary indices, wherein the decoder memory means uses at least one set of primary indices to address entries within the at least one pre-designed VQ table;

decoder mapping unit for mapping at least one index from the set of secondary indices to the at least one set of primary indices;

retrieval means for retrieving at least one entry from the decoder memory means by mapping the at least one index as mapped by the decoder mapping unit to at least one entry from the decoder memory means, wherein the at least one entry best represents the feature vector.

8. A coder for coding feature vectors of a signal, comprising:

extraction means for extracting an input feature vector from the signal;

coder memory means for storing first, second and third pre-designed VQ tables for the coder, the coder memory means using first, second and third sets of primary indices to address entries within the first, second and third pre-designed VQ tables, respectively;

three (3) coder mapping units for mapping indices from a first set of fixed length secondary indices to the first set of primary indices and from a second set of fixed length secondary indices to the second and third sets of primary indices, wherein the first and second sets of secondary indices correspond to 3 subsets of the first, second and third sets of primary indices of the first, second and third pre-designed VQ tables, respectively;

search means coupled to the 3 coder mapping units for searching for 2 secondary indices out of the first and second sets of secondary indices, wherein each of the 2 secondary indices from the first and second sets of secondary indices corresponds to 3 indices from the first, second and third sets of primary indices which correspond to 3 entries in the coder memory means' 3 pre-designed VQ tables, wherein the 3 entries best represent the input feature vector according to predetermined criteria.

9. The system according to claim 8, wherein the 3 coder mapping units are implemented using first, second and third lookup tables, wherein:

first lookup table comprises: {96, 52, 20, 54, 86, 114, 82, 68, 36, 121, 48, 92, 18, 120, 94, 124, 50, 125, 4, 100, 28, 76, 12, 117, 81, 22, 90, 116, 127, 21, 108, 66};

second lookup table comprises: {31, 21, 9, 3, 10, 2, 19, 26, 4, 3, 11, 29, 15, 27, 21, 12}; and third lookup table comprises: {16, 1, 0, 0, 8, 25, 22, 20, 19, 23, 20, 31, 4, 31, 20, 31}.

10. The system according to claim 8, wherein the 3 coder mapping units comprise:

first means for generating a mapping from a secondary index to a primary index in accordance with a first set of ordered pairs of secondary and primary indices respectfully, comprising: {0,96}, {1,52},{2,20}, {3,54}, {4,86}, {5,114},{6,82}, {7,68}, {8,36}, {9,121},{10,48}, {11, 92}, {12,18}, {13,120}, {14, 94}, {15,124}, {16,50}, {17,125}, {18,4}, {19,100}, {20,28}, {21,76}, {22,12}, {23,117}, {24,81}, {25, 22}, {26,90}, {27,116}, {28,127}, {29,21}, {30, 108}, {31,66};

second means for generating a mapping from a secondary index to a primary index in accordance with a second set of ordered pairs of secondary and primary indices respectively, comprising: {0,31}, {1,21}, {2,9}, {3,3}, {4,10}, {5,2}, {6,19}, {7,26}, {8,4}, {9,3}, {10,11}, {11,29}, {12,15}, {13,27}, {14,21}, {15,12};

third means for generating a mapping from a secondary index to a primary index in accordance with a third set of ordered pairs of secondary and primary indices respectively, comprising: {0,16}, {1,1}, {2,0}, {3,0}, {4,8}, {5,25}, {6,22}, {7,20}, {8,19}, {9,23}, {10,20}, {11,31}, {12,4}, {13,31}, {14,20}, {15,31}.

11. A decoder for decoding a feature vector of a coded signal based on a first and second set of fixed length secondary indices, wherein the coded signal has been coded by a coder with first, second and third pre-designed VQ tables, comprising:

means for receiving the first and second secondary indices;

decoder memory means for storing the first, second and third pre-designed VQ tables which are the same VQ tables as stored by the coder, the decoder memory means using first, second and third sets of primary indices to address entries within the first, second and third pre-designed VQ tables;

three (3) decoder mapping units for mapping the first secondary index to a first primary index out of the first set of primary indices, and mapping the second secondary index to second and third primary indices out of the second and third sets of primary indices;

retrieval means for retrieving 3 entries from the decoder memory means by mapping the first, secondary and third primary indices as mapped by the three decoder mapping units to 3 entries from the decoder memory means, wherein the 3 entries best represent the feature vector.

12. A system for coding and decoding feature vectors of a signal transmitted through a communications channel, comprising a coder and a decoder, wherein:

a) the coder comprises:

extraction means for extracting an input feature vector from the signal;

coder memory means for storing first, second and third pre-designed VQ tables for the coder, the coder memory means using first, second and third sets of primary indices to address entries within the first, second and third pre-designed VQ tables, respectively;

three (3) coder mapping units for mapping indices from a first set of fixed-length secondary indices to the first set of primary indices and from a second set of fixed-length secondary indices to the second and third sets of primary indices, the first and second sets of secondary indices corresponding to 3 subsets of the first, second and third sets of primary indices of the first, second and third pre-designed VQ tables, respectively;

search means coupled to the 3 coder mapping units for searching for 2 secondary indices out of the first and second sets of secondary indices, wherein each of the 2 secondary indices from the first and second sets of secondary indices corresponds to 3 entries from the first, second and third set of primary indices, wherein the 3 entries best represent the input feature vector according to predetermined criteria; and b) the decoder comprises:

means for receiving the first and second secondary indices;

decoder memory means for storing the first, second and third pre-designed VQ tables, the decoder memory means using first, second and third sets of primary indices to address entries within the first, second and third pre-designed VQ tables;

three (3) decoder mapping units for mapping the first secondary index to a first primary index out of the first set of primary indices, and mapping the second secondary index to second and third primary indices out of the second and third sets of primary indices;

retrieval means for retrieving 3 entries from the decoder memory means by mapping the first, second and third primary indices as mapped by the three decoder mapping units to 3 entries from the decoder memory means, wherein the 3 entries best represent the input feature vector.

13. The system according to claim 12, wherein said signal comprises an encoded speech signal comprising a speech period and a silence period, and wherein said speech period is encoded in accordance with said three pre-designed VQ tables, and said silence period is encoded in defined with said first and second set of secondary indices.

14. The system according to claim 12, wherein the 3 coder mapping units are implemented using first, second and third lookup tables, wherein:

first lookup table comprises: {96, 52, 20, 54, 86, 114, 82, 68, 36, 121, 48, 92, 18, 120, 94, 124, 50, 125, 4, 100, 28, 76, 12, 117, 81, 22, 90, 116, 127, 21, 108, 66};

second lookup table comprises: {31, 21, 9, 3, 10, 2, 19, 26, 4, 3, 11, 29, 15, 27, 21, 12}; and third lookup table comprises: {16, 1, 0, 0, 8, 25, 22, 20, 19, 23, 20, 31, 4, 31, 20, 31}.

15. The system according to claim 12, wherein the 3 coder mapping units comprise:

first means for generating a mapping from a secondary index to a primary index in accordance with a first set of ordered pairs of secondary and primary indices respectfully, comprising: {0,96}, {1,52}, {2,20}, {3,54}, {4,86}, {5,114}, {6,82}, {7,68},{8,36}, {9,121},{10,48}, {11, ρ}, {12,18}, {13,120}, {14,94}, {15,124}, {16,50}, {17,125}, {18,4}, {19,100}, {20, 28}, {21,76}, {22,12}, {23,117}, {24,81}, {25,22}, {26,90}, {27,116}, {28,127}, {29,21}, {30, 108}, {31, 66};

second means for generating a mapping from a secondary index to a primary index in accordance with a second set of ordered pairs of secondary and primary indices respectively, comprising: {0,31}, {1,21}, {2,9}, {3,3}, {4,10}, {5,2}, {6,19}, {7,26}, {8,4}, {9,2}, {10,11}, {11,29}, {12,15}, {13,27}, {14,21}, {15,12};

third means for generating a mapping from a secondary index to a primary index in accordance with a third set of ordered pairs of secondary and primary indices respectively, comprising: {0,16}, {1,1}, {2,0}, {3,0}, {4,8}, {5,25}, {6,22}, {7,20}, {8,19}, {9,23}, {10,20}, {11,31}, {12,4}, {13,31}, {14,20}, {15,31}.

* * * * *

UNITED STATES PATENT AND TRADEMARK OFFICE
CERTIFICATE OF CORRECTION

PATENT NO. : 5,920,853  Page 1 of 1
APPLICATION NO. : 08/702780
DATED : July 6, 1999
INVENTOR(S) : Benyassine et al.

It is certified that error appears in the above-identified patent and that said Letters Patent is hereby corrected as shown below:

In the claims, column 6, lines 52-54, delete "to an entry in the coder memory means which best represents the input feature vector according to predetermined criteria."

In the claims, column 7, lines 31-33, delete "to at least one entry in the coder memory means which best represents the input feature vector according to predetermined criteria."

In the claims, column 8, lines 4-6, delete "to at least one entry in the coder memory means which best represents the input feature vector according to predetermined criteria."

Signed and Sealed this

Twenty-fourth Day of August, 2010

David J. Kappos
*Director of the United States Patent and Trademark Office*